United States Patent
Sakurai

(10) Patent No.: US 10,637,448 B1
(45) Date of Patent: Apr. 28, 2020

(54) LOW-POWER HIGH-SPEED SCHMITT TRIGGER WITH HIGH NOISE REJECTION

(71) Applicant: TEXAS INSTRUMENTS INCORPORATED, Dallas, TX (US)

(72) Inventor: Satoshi Sakurai, San Carlos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/429,686

(22) Filed: Jun. 3, 2019

(51) Int. Cl.
| H03K 3/356 | (2006.01) |
| H03K 3/3565 | (2006.01) |
| H03K 17/16 | (2006.01) |
| H03K 17/0814 | (2006.01) |
| H03K 19/003 | (2006.01) |
| H03K 19/094 | (2006.01) |
| H03K 3/037 | (2006.01) |

(52) U.S. Cl.
CPC ......... *H03K 3/3565* (2013.01); *H03K 3/0377* (2013.01); *H03K 17/08142* (2013.01); *H03K 17/161* (2013.01); *H03K 19/00361* (2013.01); *H03K 19/094* (2013.01)

(58) Field of Classification Search
CPC ............... H03K 3/3565; H03K 3/0377; H03K 17/08142; H03K 17/161; H03K 19/00361; H03K 19/094
See application file for complete search history.

(56) References Cited

U.S. PATENT DOCUMENTS

| 4,733,107 | A | | 3/1988 | O'Shaughnessy et al. |
| 5,341,033 | A | * | 8/1994 | Koker .................. H03K 3/013 327/206 |
| 6,486,717 | B2 | * | 11/2002 | Kinoshita .............. H03K 3/021 327/165 |
| 7,023,367 | B1 | * | 4/2006 | Manganaro ......... H03M 1/0614 341/136 |
| 7,362,175 | B2 | * | 4/2008 | Arques ................ H03F 1/0205 330/264 |

OTHER PUBLICATIONS

Filanovsky, I.M and H. Baltes, "CMOS Schmitt Trigger Design." IEEE Transactions on Circuits and Systems-1: Fundamental Theory and Applications, vol. 41, No. 1, Jan. 1994, pp. 46-49.

Chen, Shih-Lun and Ming-Dou Ker, "A New Schmitt Trigger Circuit in a 0.13-μm 1/2.5-V CMOS Process to Receive 3.3-V Input Signals." IEEE Transactions on Circuits and Systems-II: Express Briefs, vol. 52, No. 7, Jul. 2005, pp. 361-365.

Kumar, Munish et al. "Design of CMOS Schmitt Trigger." International Journal of Engineering and Innovative Technology (IJEIT) vol. 2, Issue 1, Jul. 2012, pp. 252-255.

Melek, Luiz Alberto Pasini et al. "Analysis and Design of the Classical CMOS Schmitt Trigger in Subthreshold Operation." IEEE Transactions on Circuits and Systems-I: Regular Papers, vol. 64, No. 4, Apr. 2017, pp. 869-878.

Texas Instruments, "TPS1HA08-Q1, 40-V, 8-mΩ Single-Channel Smart High-Side Switch." Nov. 2018, Revised Jan. 2019, 57 pages.

* cited by examiner

*Primary Examiner* — Dinh T Le
(74) *Attorney, Agent, or Firm* — John R. Pessetto; Charles A. Brill; Frank D. Cimino

(57) ABSTRACT

A circuit includes a first resistor coupled to a supply voltage node. The circuit further includes a first pair of transistors and a second pair of transistors. The first pair of transistors is coupled in series between the first resistor and an output node. The second pair of transistors is coupled in series between the output voltage node and a ground nod. A first capacitor is coupled in parallel across the first resistor.

6 Claims, 4 Drawing Sheets

LOW-POWER HIGH-SPEED SCHMITT TRIGGER WITH HIGH NOISE REJECTION

BACKGROUND

A Schmitt Trigger (ST) is a bistable circuit in which the output changes state when the input rises above an upper threshold and again changes state when the input falls below a lower threshold. An ST thus includes hysteresis, which is useful to reject input noise and glitches. The difference between the upper threshold voltage and the lower threshold voltage is the hysteresis voltage. ST circuits are often used as input buffers to an integrated circuit. As an input buffer, the ST circuit differentiates its input signal being a logic "high" versus a logic "low".

SUMMARY

A circuit includes a first resistor coupled to a supply voltage node. The circuit further includes a first pair of transistors and a second pair of transistors. The first pair of transistors is coupled in series between the first resistor and an output node. The second pair of transistors is coupled in series between the output voltage node and a ground nod. A first capacitor is coupled in parallel across the first resistor.

BRIEF DESCRIPTION OF THE DRAWINGS

For a detailed description of various examples, reference will now be made to the accompanying drawings in which.

DETAILED DESCRIPTION

Figure 1:
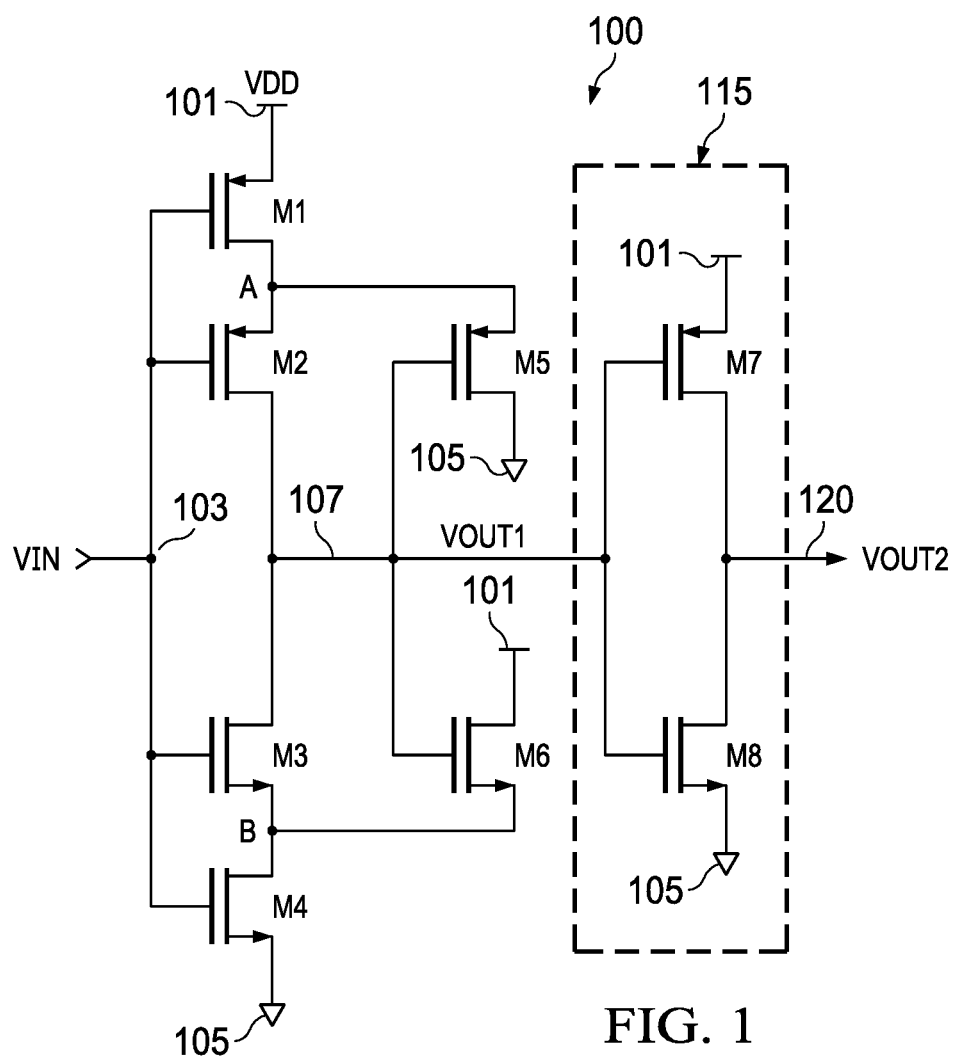
FIG. 1 illustrates a Schmitt Trigger circuit in accordance with an example.

FIG. 1 is a schematic of an example ST circuit 100. This example ST circuit 100 includes transistors M1, M2, M3, M4, M5, M6, M7, and M8. In this example, M1, M2, M5, and M7 comprise p-type metal oxide semiconductor field effect transistors (PMOS) and M3, M4, M6, and M8 comprise n-type metal oxide semiconductor field effect transistors (NMOS). In other example implementations, any or all of M1-M8 can be implemented with other types of transistors.

M1 and M2 comprise a series-connected pair of transistors. This series pair M1/M2 is connected between a supply voltage node 101 (VDD) and an output voltage node 107 (VOUT1). Similarly, M3 and M4 also comprise a series-connected pair of transistors connected between the output voltage node 107 and a ground node 105. The gates of M1-M4 are connected together at an input node 103 at which the input signal VIN is provided. Node 107 is the node interconnecting the drains of M2 and M3. The gates of M5 and M6 are connected to the output node 107.

The drain of M5 is connected to the ground node 105, and the drain of M6 is connected to the supply voltage node 101. The source of M5 is connected to the node interconnecting the drain of M1 with the source of M2 (node A). The source of M6 is connected to the node interconnecting the drain of M4 with the source of M3 (node B). When M6 is on, which is the case when VOUT1 on node 107 is high, the voltage on node B is pulled high through M6. Similarly, when M5 is on, which is the case when VOUT1 is low, the voltage on node A is pulled low through M5.

The ST circuit example of FIG. 1 also includes an inverter 115 comprising the transistors M7 and M8. Inverter 115 inverts the logic state of VOUT1 if an output voltage having the same logic state as the input VIN voltage is desired. The drains of M7 and M8 are connected together at the output node 120 (VOUT2), and the source of M7 is connected to VDD, while the source of M8 is connected to ground. When VOUT1 is low, M7 will be on thereby pulling VOUT2 high. Conversely, when VOUT1 is high, M8 will be on thereby pulling VOUT2 low.

When VIN is low (e.g., ground potential), PMOS devices M1 and M2 are on, and NMOS devices M3 and M4 are off. With M1 and M2 being on, VOUT1 is pulled up to VDD through M1 and M2, and thus VOUT2 is low. When VIN is high (e.g., VDD), M1 and M2 are off, and M3 and M4 are on. With M3 and M4 being on, VOUT1 is pulled low to ground through M3 and M4 and thus the VOUT2 is high. Transistors M5 and M6 cause the ST circuit 100 of FIG. 1 to implement an upper threshold and a lower threshold to thereby provide hysteresis. If VIN is low (and VOUT2 also is low), VOUT1 will not transition to a logic low signal level until VIN exceeds the upper threshold, at which time VOUT1 becomes a low signal level. As VIN then decreases, VOUT1 will remain low until VIN falls below the lower threshold, at which time VOUT1 will be forced high.

As explained above, when VIN is low M1 and M2 are on, and M3 and M4 are off. When VIN is high, M3 and M4 are on, and M1 and M2 are off. Thus, generally, only one of the transistor pairs M1/M2 or M3/M4 is on at any point in time. However, during the progression of VIN from low to high or from high to low, a small voltage range may exist at which, to some degree, all four transistors M1-M4 in the stack between VDD and ground are on thereby creating a "shoot-through" condition. When all four transistors M1-M4 are on, a high level of current flows from VDD to ground through the stack of transistors. Such a shoot-through current is a contributor for the ST circuit 100 to have a relatively high power consumption during a slowly moving VIN signal.

Figure 2:
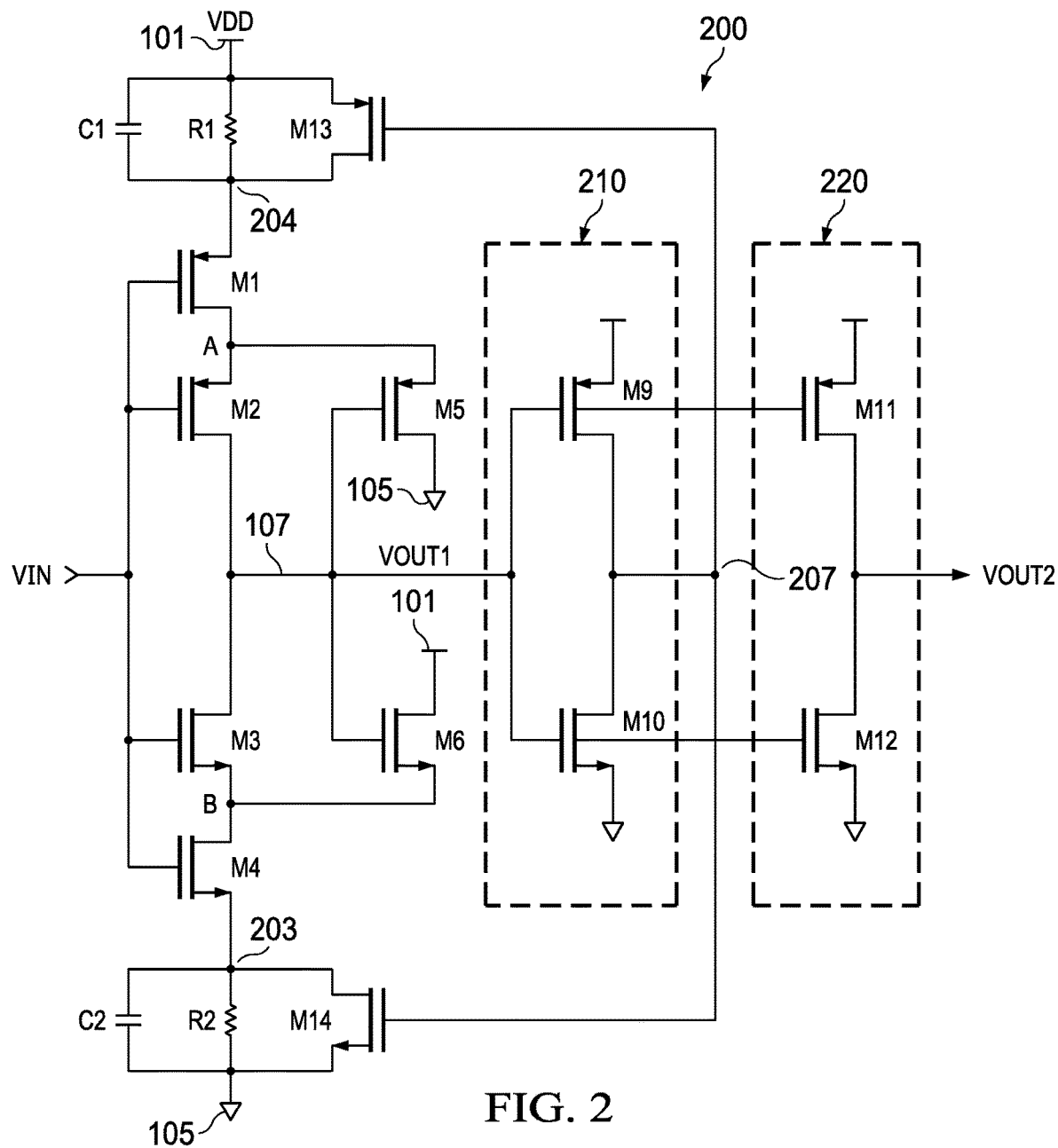
FIG. 2 illustrates another example of a Schmitt Trigger circuit.

FIG. 2 shows an example of an ST circuit 200 that addresses the shoot-through current problem characteristic of the ST circuit 100 of FIG. 1. The ST circuit 200 of FIG. 2 includes transistors M1-M5 connected as described above with respect to the ST circuit 100. A first inverter 210 comprises transistors M9 and M10 and inverts VOUT1 to a voltage on node 207. A second inverter 220 comprises transistors M11 and M12 connected together to invert VOUT1 to produce VOUT2. VOUT2 thus has the same polarity as VIN.

Resistors R1 and R2 are included on opposite ends of the stack of transistors M1-M4. Resistor R1 is connected between VDD and the source of M1, and resistor R2 is connected to between the source of M4 and ground. Resistors R1 and R2 introduce resistance between VDD and ground during the state in which all four transistors M1-M4 are on to some degree (sub-threshold, linear, or saturation) and a large shoot-through current would otherwise occur. With the combined resistance of the R1 and R2, the shoot-through current of the ST circuit 200 is greatly reduced compared to that of the ST circuit 100.

However, the addition of R1 and R2 introduces another problem. As M4 begins to turn on, current begins to flow through R2, and the voltage across R2 increases. The voltage across R2 is on node 203, which also connects to the source of M4. As such, as the voltage on node 203 increases, the gate-to-source voltage (Vgs) of M4 decreases (for a given M4 gate voltage). As VIN increases, the Vgs of M4 is held to a lower level due to the increasing voltage across R2, and thus the time M4 takes to turn on increases. The same problem occurs as M1 turns with current flowing through resistor R1. Thus, the switching speed of the ST circuit 200 is slower than the switch speed of the ST circuit 100 of FIG. 1. Consequently, the propagation delay is longer for ST circuit 200 than for ST circuit 100.

To address the switching speed problem introduced by resistors R1 and R2, capacitors C1 and C2 are coupled in parallel across the resistors. C1 is coupled in parallel across R1, and C2 is coupled in parallel across R2. C1 and C2 can be implemented as MOS transistors with the drain connected to the source, or as capacitors themselves. The capacitors C1 and C2 function to hold the voltage across their respective resistors to a lower level for a longer period of time compared to what would have been the case in the circuit of FIG. 2 absent C1 and C2. Before M4 is turned on, no drain current flows through M4 and thus no current flows through R2. The voltage on node 203 and thus on the capacitor C2 is 0V. As M4 begins to turn on, the current begins to charge capacitor C2, and the voltage on the upper plate of C2 connected to node 203 begins to increase at a rate proportional to the ratio of the M4 drain current and the capacitance of C2. With the voltage on the source of M4 being held to a lower level due to C2, the Vgs of M4 is larger thereby increasing the drain current through M4, and causing M4 to turn on faster than would have been the case with R2, but without C2. In a similar fashion, C1 holds the voltage on node 204 (source of M1) to a higher level for a longer period of time than would have been the case in FIG. 2 with R1 but absent C1.

Transistor M13 is a PMOS transistor in this example and functions to short capacitor C1 to thereby discharge C1 after M1 turns on. The gate of M13 is driven by the voltage on node 207. Similarly, M14 (which is an NMOS transistor) discharges C2 after M4 turns on. The capacitances of C1 and C2 are application-specific. C1 and C2 should be large enough to adequately hold the voltages on the sources of M1 and M4 to levels sufficient to turn on M1 and M4 faster than if C1 and C2 were not present. However, the amount of time for C1 and C2 to discharge is a function of their capacitances, so the sizes of C1 and C2 should not be too large. The larger are C1 and C2, the more time they will take to discharge, which in turn places an upper limit on the frequency of VIN-VIN cannot toggle between low and high at frequency that is too fast to permit C1 and C2 to adequately discharge.

Resistors R1 and R2 limits the shoot-through current through transistors M1-M4, and capacitors C1 and C2 cause the ST circuit 200 to maintain a relatively fast switching time. Including the combination of R1/C1 and R2/C2 on both ends of the transistor stack comprising M1-M4 causes the switching speed of the ST 200 to be relatively high. If, however, the switching speed of the ST 200 need only be high in one direction (e.g., transitioning from low to high, or from high to low), then in some examples, a capacitor may not be included in parallel with the corresponding resistor. For example, C1, R1, and M13 can be provided as shown in FIG. 2, but R2 is included at the other end of the transistor stack and without capacitor C2 and transistor M14. Alternatively, C2, R2, and M14 can be provided as shown in FIG. 2, but R1 is included at the other end of the transistor stack and without capacitor C1 and transistor M13.

Figure 3:
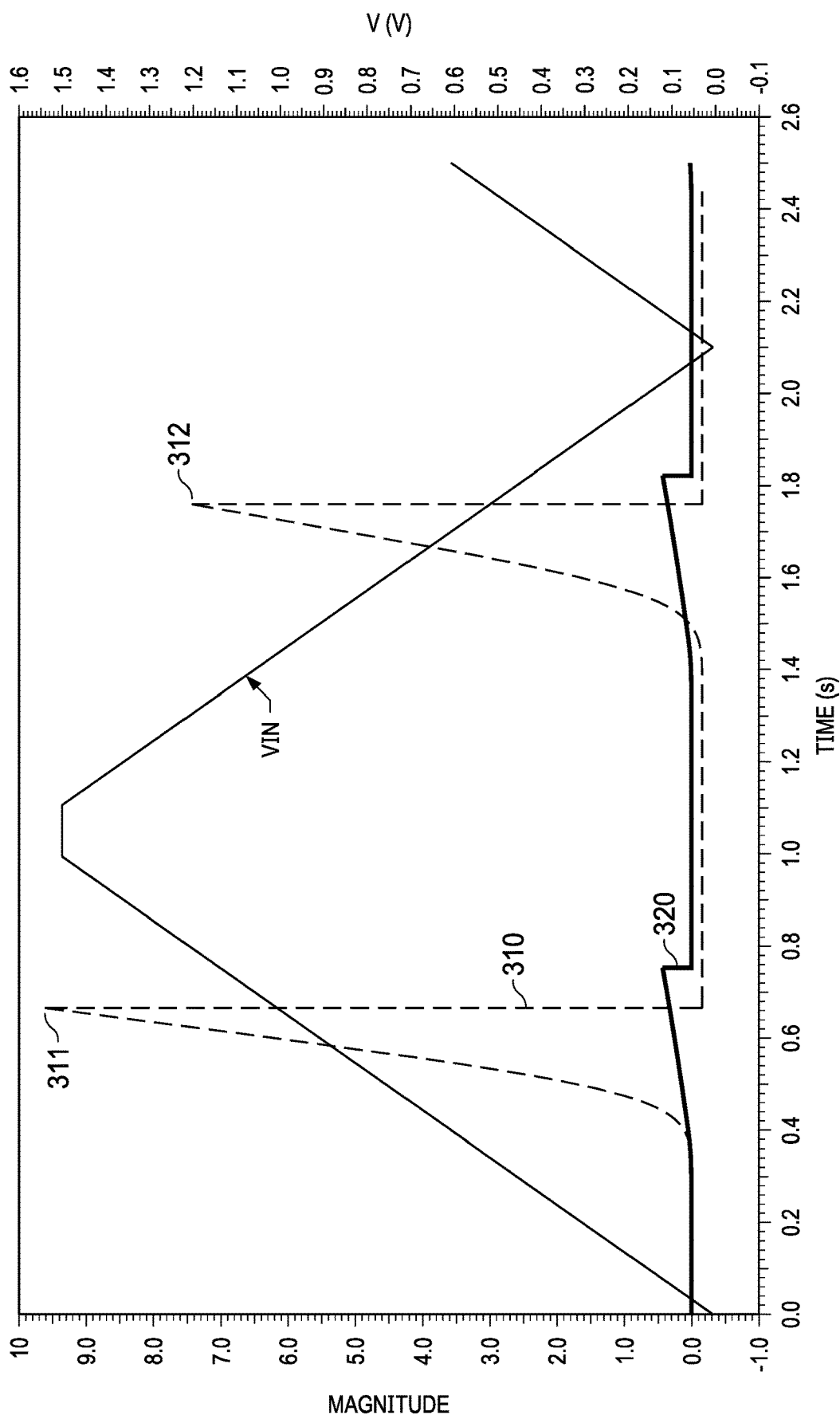
FIG. 3 illustrates the difference in shoot-through current between the example Schmitt Trigger circuits of FIGS. 1 and 2.

FIG. 3 illustrates three waveforms including VIN and waveforms 310 and 320. VIN is shown making a slow ramp up follow by a slow ramp down. Waveform 310 represents the current through the transistor stack M1-M4 for ST circuit 100 of FIG. 1, and waveform 320 shows the current through the transistor stack for the ST circuit 200 of FIG. 2. At the switching points of the ST circuit 100, large shoot-through current spikes 311 and 312 occur due to all four transistors being on at those points in time. The shoot-through current shown in waveform 320 for the ST circuit 200 is much smaller due to the inclusion of resistors R1 and R2 in series with the transistor stack M1-M4.

Figure 4:
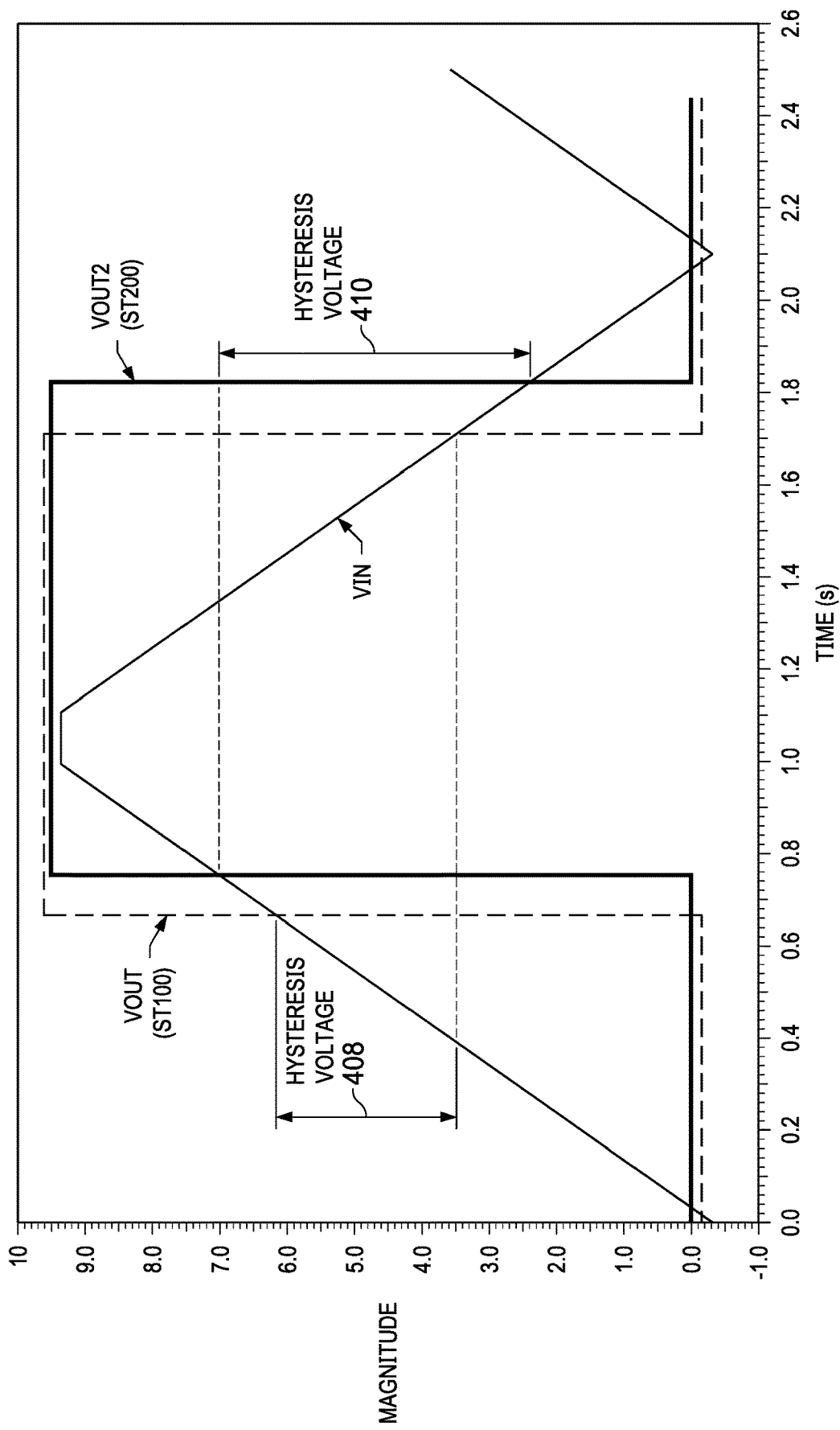
FIG. 4 illustrates the difference in hysteresis voltage between the example Schmitt Trigger circuits of FIGS. 1 and 2.

FIG. 4 illustrates VOUT2 versus VIN for both ST circuits 100 and 200 as VIN ramps up and then back down. The hysteresis voltage is the difference in the thresholds for ST circuit. As can be seen, the hysteresis voltage 410 for ST circuit 200 is larger than the hysteresis voltage 408 for ST circuit 100. ST circuit 200 has a larger hysteresis voltage than ST circuit 100 due to the inclusion of resistors R1 and R2. Consider a case for ST 200 where Vin is transitioning from low to high. With Vin low, node 207 is low and M14 is off. With M14 being off, resistor R2 is in series with M4. If Vin were to be slowly increased, Vin will require higher voltage to turn on M4 because the Vgs of M4 is reduced by the voltage across R2. At the same time, M13 is still on and R1 is shorted out and M1 sees the full VDD-Vin as its VGS. In this case, the effect of M4 is weaker and the effect of M1 normal. The same effect occurs when VIN transitions from high to low and the Vgs of M1 is reduced due to the voltage across resistor R1. A larger hysteresis voltage enables the ST circuit to be more immune to large noise glitches on the input signal VIN than with smaller hysteresis.

Compared to the ST circuit 100 of FIG. 1, the ST circuit 200 of FIG. 2 has a larger hysteresis voltage which allows similar and possibly better noise and glitch rejection, has a smaller shoot-through current which results in a smaller power consumption, and maintains a fast switching speed and thus a small propagation delay.

In this description, the term "couple" or "couples" means either an indirect or direct wired or wireless connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. A circuit, comprising:
    a first resistor coupled to a supply voltage node;
    a first pair of transistors coupled in series between the first resistor and an output node;
    a second pair of transistors coupled in series between the output node and a ground node;
    a first capacitor coupled in parallel across the first resistor;
    a second resistor coupled between the second pair of transistors and the ground node; and
    a second capacitor coupled in parallel across the second resistor;
    further comprising a first transistor coupled to the first capacitor and configured to discharge the first capacitor, and comprising a second transistor coupled to the second capacitor and configured to discharge the second capacitor.

2. The circuit of claim 1, further comprising an inverter coupled to the output node, the inverter having an output, and the output of the inverter is coupled to a control input of the first transistor and a control input of the second transistor.

3. A circuit, comprising:
a first resistor coupled to a supply voltage node;
a first pair of transistors coupled in series between the first resistor and an output node;
a second pair of transistors coupled in series between the output node and a ground node; and
a first capacitor coupled in parallel across the first resistor;
further comprising:
a first inverter coupled to the output node, the first inverter having a first inverter output; and
a second inverter coupled to the first inverter output.

4. A circuit, comprising:
a first resistor coupled to a supply voltage node;
a first pair of transistors coupled in series between the first resistor and an output node;
a second pair of transistors coupled in series between the output node and a ground node; and
a first capacitor coupled in parallel across the first resistor;
wherein the supply voltage is a positive voltage node.

5. A circuit, comprising:
a first resistor coupled to a supply voltage node;
a first pair of transistors coupled in series between the first resistor and an output node;
a second pair of transistors coupled in series between the output node;
a second resistor coupled between the second pair of transistors and a ground node;
a first capacitor coupled in parallel across the first resistor;
a second capacitor coupled in parallel across the second resistor;
further comprising a first transistor coupled in parallel with the first resistor and comprising a second transistor coupled in parallel with the second resistor, the first transistor having a first control input and the second transistor having a second control input.

6. A circuit, comprising:
a first resistor coupled to a supply voltage node;
a first pair of transistors coupled in series between the first resistor and an output node;
a second pair of transistors coupled in series between the output node;
a second resistor coupled between the second pair of transistors and a ground node;
a first capacitor coupled in parallel across the first resistor;
a second capacitor coupled in parallel across the second resistor;
a first inverter coupled to the output node, the first inverter having a first inverter output coupled to the first control input and to the second control input;
further comprising a second inverter coupled to the first inverter output.

* * * * *